United States Patent
Boeve et al.

(10) Patent No.: US 7,660,180 B2
(45) Date of Patent: Feb. 9, 2010

(54) DIELECTRIC ANTIFUSE FOR ELECTRO-THERMALLY PROGRAMMABLE DEVICE

(75) Inventors: Hans M. B. Boeve, Hechtel-Eksel (BE); Karen Attenborough, Hechtel-Eksel (BE); Godefridus A. M. Hurkx, Best (NL); Prabhat Agarwal, Brussels (BE); Hendrik G. A. Huizing, Neerkant (NL); Michael A. A. In'T Zandt, Veldhoven (NL); Jan W. Slotboom, Eersel (NL)

(73) Assignee: NXP B.V., Eindhoven (NL)

( * ) Notice: Subject to any disclaimer, the term of this patent is extended or adjusted under 35 U.S.C. 154(b) by 200 days.

(21) Appl. No.: 11/720,320

(22) PCT Filed: Nov. 24, 2005

(86) PCT No.: PCT/IB2005/053898

§ 371 (c)(1),
(2), (4) Date: Dec. 7, 2007

(87) PCT Pub. No.: WO2006/072842

PCT Pub. Date: Jul. 13, 2006

(65) Prior Publication Data

US 2008/0144355 A1 Jun. 19, 2008

(30) Foreign Application Priority Data

Nov. 30, 2004 (EP) .................................. 04106181

(51) Int. Cl.
*G11C 17/18* (2006.01)
(52) U.S. Cl. ..................... 365/225.7; 365/126; 365/175; 365/243
(58) Field of Classification Search ............. 365/225.7, 365/126, 175, 243
See application file for complete search history.

(56) References Cited

U.S. PATENT DOCUMENTS

| 5,166,758 | A | | 11/1992 | Ovshinsky et al. |
| 5,641,703 | A | * | 6/1997 | Cohen et al. ................. 438/467 |
| 5,717,230 | A | * | 2/1998 | Chua et al. ................... 257/209 |
| 5,904,507 | A | * | 5/1999 | Thomas ....................... 438/131 |
| 6,075,719 | A | | 6/2000 | Lowrey et al. |
| 6,613,604 | B2 | | 9/2003 | Maimon et al. |

(Continued)

OTHER PUBLICATIONS

"Current Status of the Phase Change Memory and Its Future", S Lai, Proc IEDM 2003, p. 225.

(Continued)

*Primary Examiner*—Thong Q Le

(57) ABSTRACT

A thermally programmable memory has a programmable element (20) of a thermally programmable resistance preferably of phase change material, material and a blown antifuse (80) located adjacent to the programmable material. Such a blown antifuse has a dielectric layer (100) surrounded by conductive layers (90, 110) to enable a brief high voltage to be applied across the dielectric to blow a small hole in the dielectric during manufacture to form a small conductive path which can be used as a tiny electrical heater for programming the material. Due to the current confinement by the hole, the volume of the material that must be heated in order to switch to a highly-resistive state is very small. As a result the programming power can be low.

23 Claims, 7 Drawing Sheets

U.S. PATENT DOCUMENTS

Figure 1:
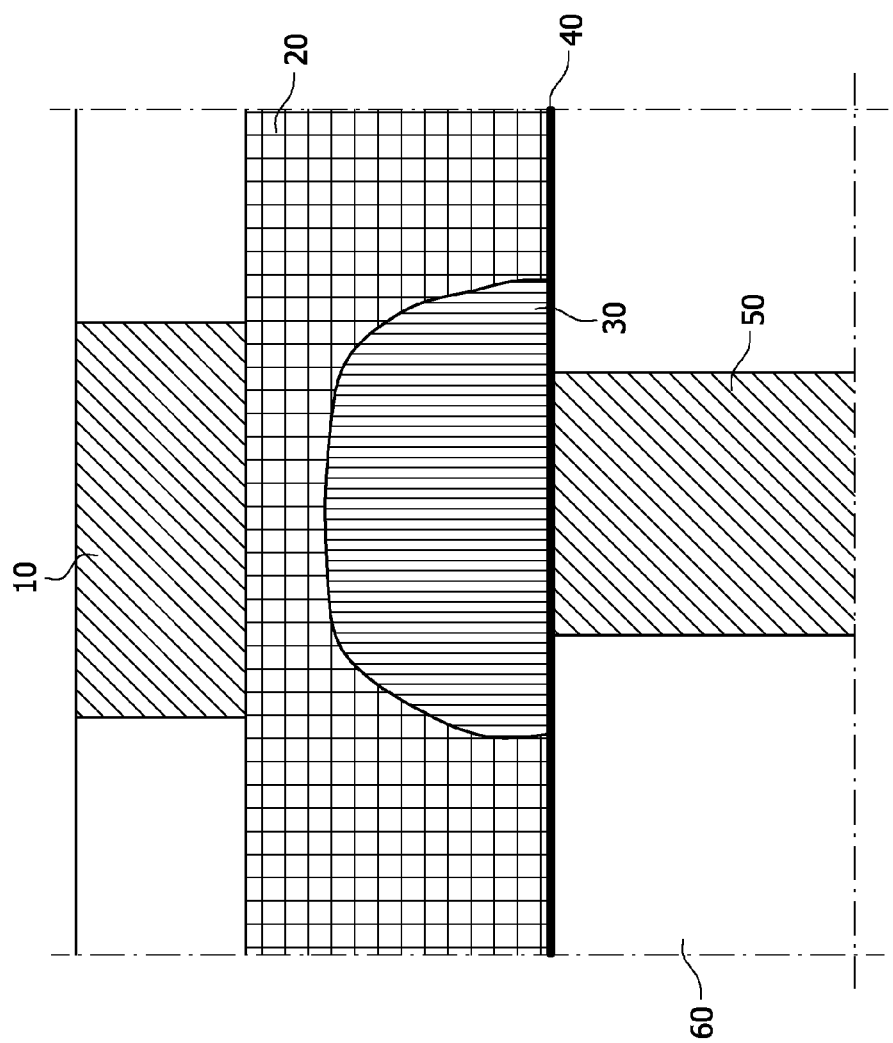

| | | | |
|---|---|---|---|
| 6,677,220 B2* | 1/2004 | Van Brocklin et al. | 438/467 |
| 7,180,123 B2* | 2/2007 | Yeh et al. | 257/314 |
| 2002/0011374 A1 | 1/2002 | Brister | |
| 2003/0104685 A1* | 6/2003 | Reinberg | 438/597 |
| 2004/0197947 A1 | 10/2004 | Fricke et al. | |
| 2005/0158950 A1 | 7/2005 | Scheuerlein et al. | |

OTHER PUBLICATIONS

"A Novel High-Density Low-Cost Diode Programmable Read Only Memory", C Degraaf et al, Proc IEDM 1996, p. 189.

"Gate Oxide Reliability of Poly-Si and Poly Sige Coms Devices", V Houtsma, PhD Thesis, Twente University, 1999.

* cited by examiner

DIELECTRIC ANTIFUSE FOR ELECTRO-THERMALLY PROGRAMMABLE DEVICE

This invention relates to thermally programmable devices, to memory using such devices, to integrated circuits having such devices, and to methods of manufacturing the same.

Known programmable devices include programmable logic and programmable memory for example. They can be based on technology using fuses or antifuses to alter paths or connections between logic devices, or on technology based on changing a state of a material for example. In either case, devices can be categorized as re-programmable or one time programmable. They can also be categorized as non volatile or volatile, depending on whether they lose their state when disconnected from a power supply. Known non-volatile memories include flash memories, FeRAMs, MRAMs, and programmable resistance devices such as phase-change memories.

As higher densities of memories are desirable for use in portable information terminals and the like, attention has been directed to phase-change non-volatile memories. A phase change memory is one example of memory based on the thermally programmable resistive properties of a material. Reference is made to S. Lai, "Current status of the phase change memory and its future", Proc. IEDM 2003, p. 255. Electric current pulses of different magnitudes are passed from one electrode to the other and resistive heating is used to change the programmable material around the bottom contact region from the highly resistive amorphous state to the crystalline state and vice versa. Resistive materials such as a resistive electrode or a resistive layer can be used to locate the heat source as close as possible to the programmable material.

Phase change materials may be programmed between a first structural state where the material is generally more amorphous (less ordered) and a second structural state where the material is generally more crystalline (more ordered). The term "amorphous" refers to a condition which is relatively structurally less ordered or more disordered than a single crystal and has a detectable characteristic, such as high electrical resistivity. The term "crystalline" refers to a condition which is relatively structurally more ordered than amorphous and has lower electrical resistivity than the amorphous state.

The phase-change material layer can comprise a chalcogenide material which is reversibly changeable in phase between an amorphous (noncrystalline) state of high resistance and a crystalline state of low resistance. The material is changed to the noncrystalline state or crystalline state by the passage of current to control the resistance value. For example when data is stored (written), the phase-change material layer is changed from the amorphous state to the crystalline state and thereby given a low resistance value. When data is to be erased, the layer is changed from the crystalline state to the amorphous state to achieve a high resistance value. The difference in resistance value is read to use the layer as a memory. The high resistance state can represent for example, a logic ONE data bit, and the low resistance state can represent for example, a logic ZERO data bit.

Early phase change materials were based on changes in local structural order. The changes in structural order were typically accompanied by atomic migration of certain species within the material. Such atomic migration between the amorphous and crystalline states made programming energies relatively high, typically in the range of about a micro joule. This energy was needed for each memory elements in a matrix of rows and columns of memory cells. This led to high current carrying requirements for address lines and for isolation between elements.

Reduced energy requirements for programming these memory cells would enable them to become a direct replacement for computer memory applications, such as tape, floppy disks, magnetic or optical hard disk drives, solid state disk flash, DRAM, SRAM, and socket flash memory. In particular, low programming energy is important when the EEPROMs are used for large-scale archival storage, to replace the mechanical hard drives (such as magnetic or optical hard drives) of computer systems. In the case of lap-top computers, this is of particular interest because the mechanical hard disk drive has heavy power consumption which can limit battery life.

US patent application 2002/0011374 shows that the programming energy requirements of a programmable resistance memory element may be reduced in several ways, including using multiple electrodes for each cell. Reduced energy by the appropriate selection of the composition of the memory material is described in U.S. Pat. No. 5,166,758.

It is also known to provide a shaped interface between a lower electrode and the phase-change material layer which is tapered toward the phase-change material layer with a decreasing cross sectional area to give a higher current density at the tapered end. This can reduce energy requirements for writing and erasing data. However, with smaller contact areas, if the contact between the electrode and the phase-change material layer is diminished, the problem of faulty conduction is liable to occur and cause a lower yield.

U.S. Pat. No. 6,613,604 shows a method of making a very small pore in a dielectric layer of programmable device and filling the pore with a phase change material. The dielectric layer seems to provide thermal insulation so that more heat from a resistive heating layer flows into and remains in the phase change material.

In the field of magnetoresistive random access memories, memory cells are known are called magnetic tunnel junctions (MTJs) that basically comprise a ferromagnet/insulator/ferromagnet multilayer structure. The insulator material is usually, but not limited to, Al oxide. Alternative insulator materials can be considered as well, such as e.g. AlN or MgO.

An object of the invention is to provide improved apparatus or methods, especially thermally programmable devices, memory using such devices, integrated circuits having such devices, and methods of manufacturing the same.

According to a first aspect, the invention provides a thermally programmable device having a programmable element of a thermally programmable material and the device having a blown antifuse or a blowable antifuse located adjacent to the programmable material. The blown antifuse or a blowable antifuse may be in contact with the thermally programmable material or may be sufficiently close so as to be able to influence this material thermally when electrically activated.

The transition from an intact antifuse to a blown antifuse makes one-time programming of the thermally programmable device possible. Such a blown antifuse typically has an extremely small conductive path, which can be exploited in at least two ways. One is as an electrical heater for programming the material. The small size of the blown antifuse can enable the heater to heat a very small volume. Preferably the blown anti-fuse dimension is sub-lithographic, that is a diameter less than 100 nm. A second use is as part of a conductive path through the programmable material, for reading a state of the material. Again the small size of the conductive path of the antifuse can enable the conductive path through the volume of the programmable material to be kept confined, and so the reading is made more sensitive to changes in a smaller volume of the programmable material. Again this can mean the device dimensions can be kept small, to enable greater integration. In principle either the heating use or the reading use could be exploited without the other, by providing separate paths for reading and for heating, but in practice the two uses are usually combined and the same path used for reading and heating. Compared to other ways of creating small conductive paths, the blown antifuse can provide greater reliability or smaller dimensions, or more controllable conductivity level for example. In principle the programmable material could be a one time programmable material, but in practice it is more useful with materials which are reversibly or repeatedly programmable.

The phase-change material can be semiconducting in the amorphous phase. In the crystalline phase it can be a semimetal that cannot be used in a pn junction. After processing the phase-change layer will be in its crystalline phase and a Schottky barrier may be formed.

The present invention also provides an antifuse phase change memory that is based on a breakdown driven constriction in a dielectric layer in the vicinity of the phase change layer. As a consequence a confined current can locally heat and transform the phase change material.

An aspect of the present invention is to reduce the size of the constriction and to limit the heat flow within the phase change material, so that the volume that is changing phase can be minimal, hence the power consumption required for a program operation is low.

An additional feature of the present invention is the programmable material having a programmable resistance. This is commercially significant as there are suitable materials available for small, reliable programmable devices, though other materials with different thermally programmable properties such as optical properties can be conceived.

An additional feature of the present invention is the blown antifuse serving as part of an electrical path for reading a state of the programmable material.

An additional feature of the present invention is the blown antifuse serving as an electrical heater for setting a state of the programmable material.

Another additional feature of the present invention is the antifuse comprising a dielectric layer surrounded by conductive layers. The dielectric layer is non-conducting before the antifuse is blown. The conductive layers enable a brief high voltage to be applied across the dielectric to blow a small hole in the dielectric during manufacture or commissioning for example, to form the small conductive path.

Another such additional feature is the device comprising a first electrode located below the antifuse, the programming material being located on the antifuse, and a second electrode being located on the programming material.

Another such additional feature is a second layer of programmable material located between the first electrode and the antifuse. This enables more programmable material to be located adjacent to the heater and so can help reduce the area of each device for a given amount of programmable material, and hence further increase integration.

An additional feature is that the antifuse is formed from a tunnel barrier layer. The tunnel barrier layer is preferably an aluminum oxide layer, for example. Any insulator in a thickness range allowing sufficient direct tunneling can be used as a 'tunnel barrier'.

An additional feature is the inclusion of one or more aluminum oxide layers for any of the following reasons: antifuse, diffusion barrier and/or adhesion layer, or combinations thereof.

Another such additional feature is the blown antifuse having a hole in the dielectric of diameter less than 100 nm.

Another aspect of the invention provides an array such as a memory having multiple addressable cells, each cell comprising the device.

As an additional feature, the memory cells are one time programmable cells.

Another aspect of the invention provides an integrated circuit.

Another aspect of the invention provides a method of manufacturing such a device having the step of blowing the antifuse.

As an additional feature the antifuse is blown before other layers are formed.

Each programmable device may include a selection device. The antifuse can be an integral part of the selection device. A layer of phase change material can be an integral part of a selection device. The selection device can be a pn diode. For example, the layer of phase change material can be an n- or a p-doped layer.

Hence, the formation of the antifuse can be combined with the formation of a small pn junction, e.g. a diode. Such a diode is a highly desirable component of a programmable-resistor based memory.

Alternatively, the selection device can be a pin diode, a punch through diode or a bipolar transistor or any other suitable device.

By using a dielectric antifuse, the programming current through an electro-thermally programmable resistor is locally confined to a very narrow region.

This has two advantages:
1) It leads to a large resistance, which can act as a resistive heating element close to or within the programmable layer.
2) Due to the current confinement the volume of the material that must be heated in order to switch to a highly-resistive state and, hence, to give a large resistance, is very small. As a result the programming power can be low.

An further advantage of the dielectric layer being sandwiched between two phase-change layers is that the removal of the heat generated in the anti-fuse opening is made more difficult than in the case of a dielectric layer between one phase change layer and a semiconductor layer such as silicon, which can have a far better thermal conductivity than the phase-change material. This can be important for both the anti-fuse formation and the programming power of the phase-change material.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

Figure 3:
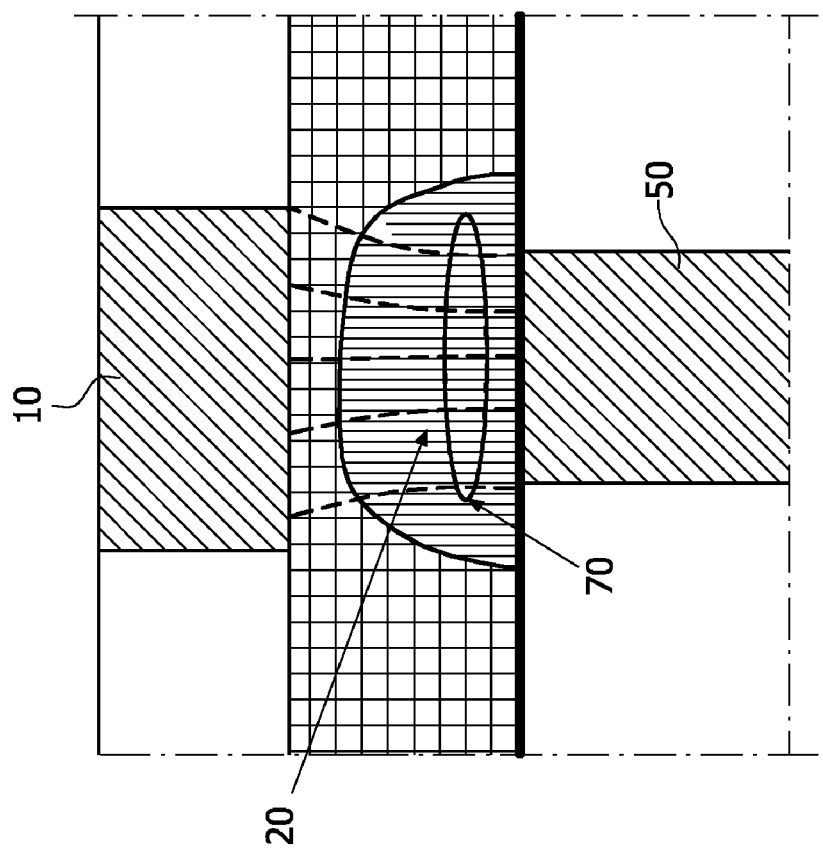
Figure 2:
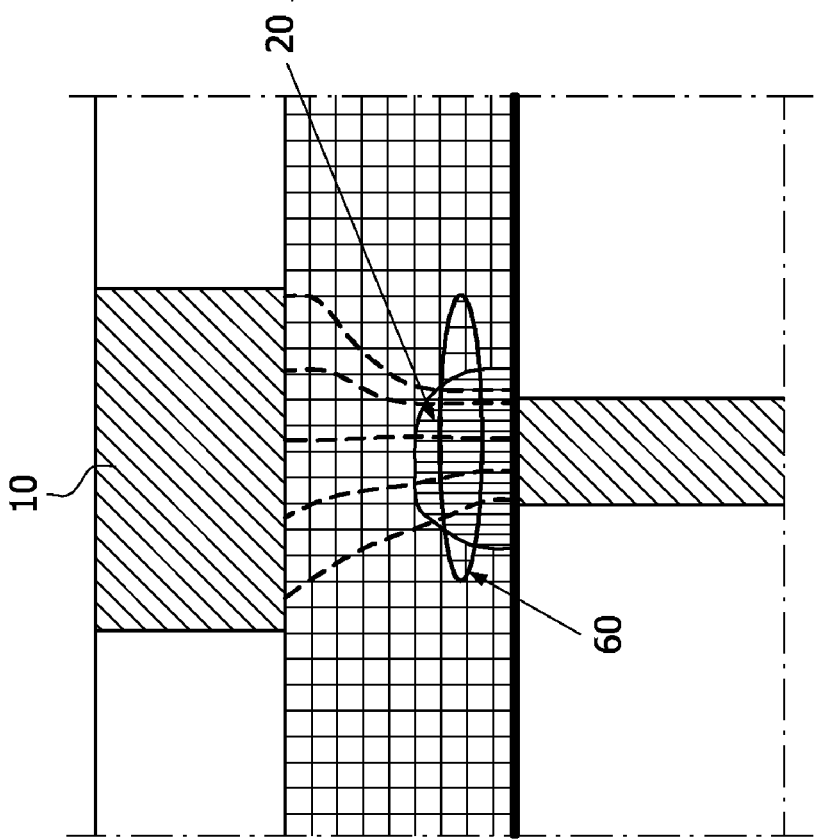
Figure 4:
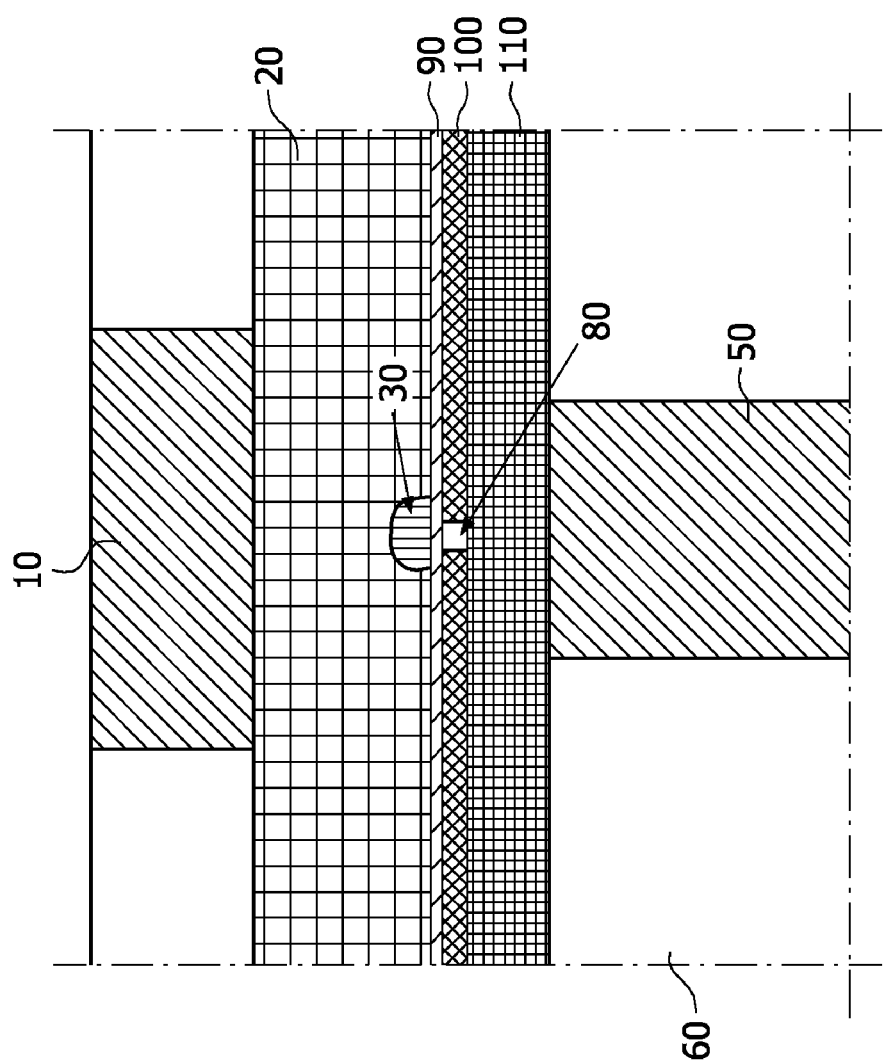
Figure 5:
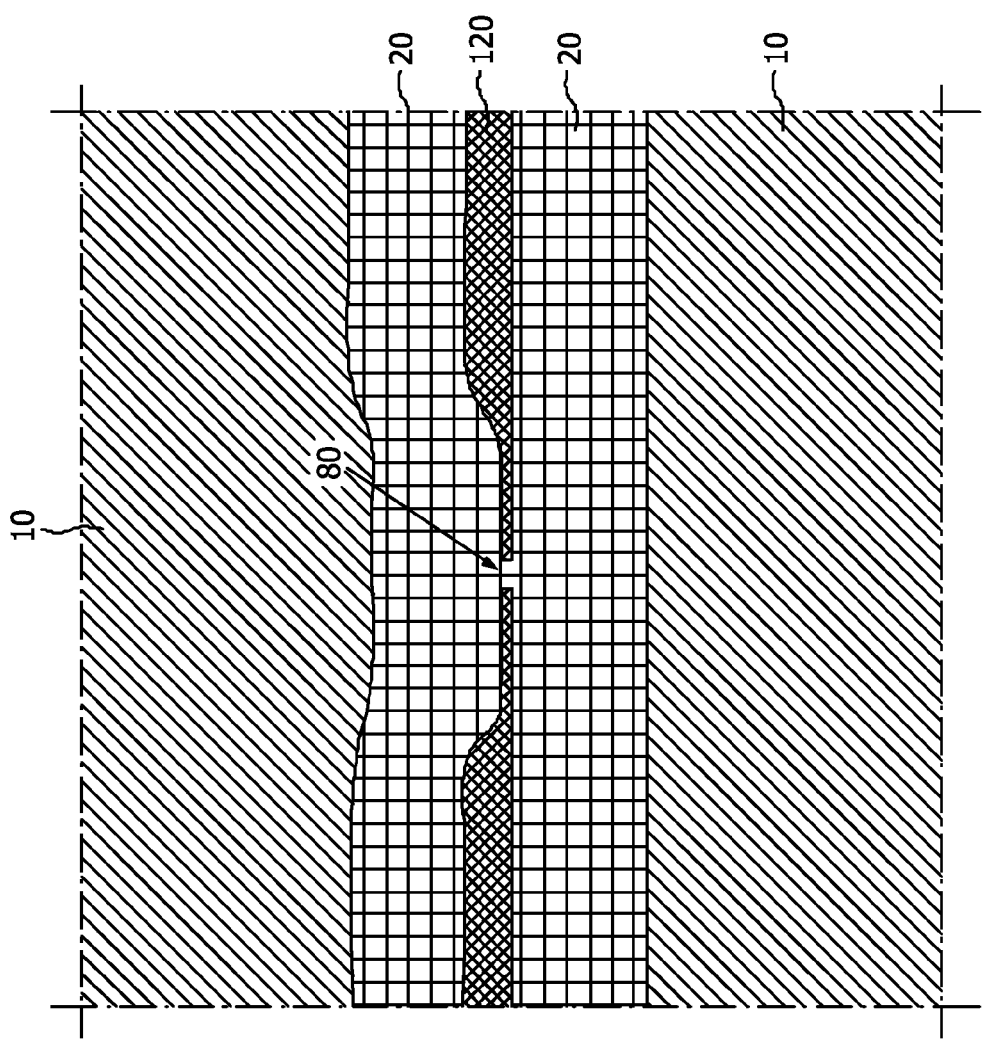
Figure 6:
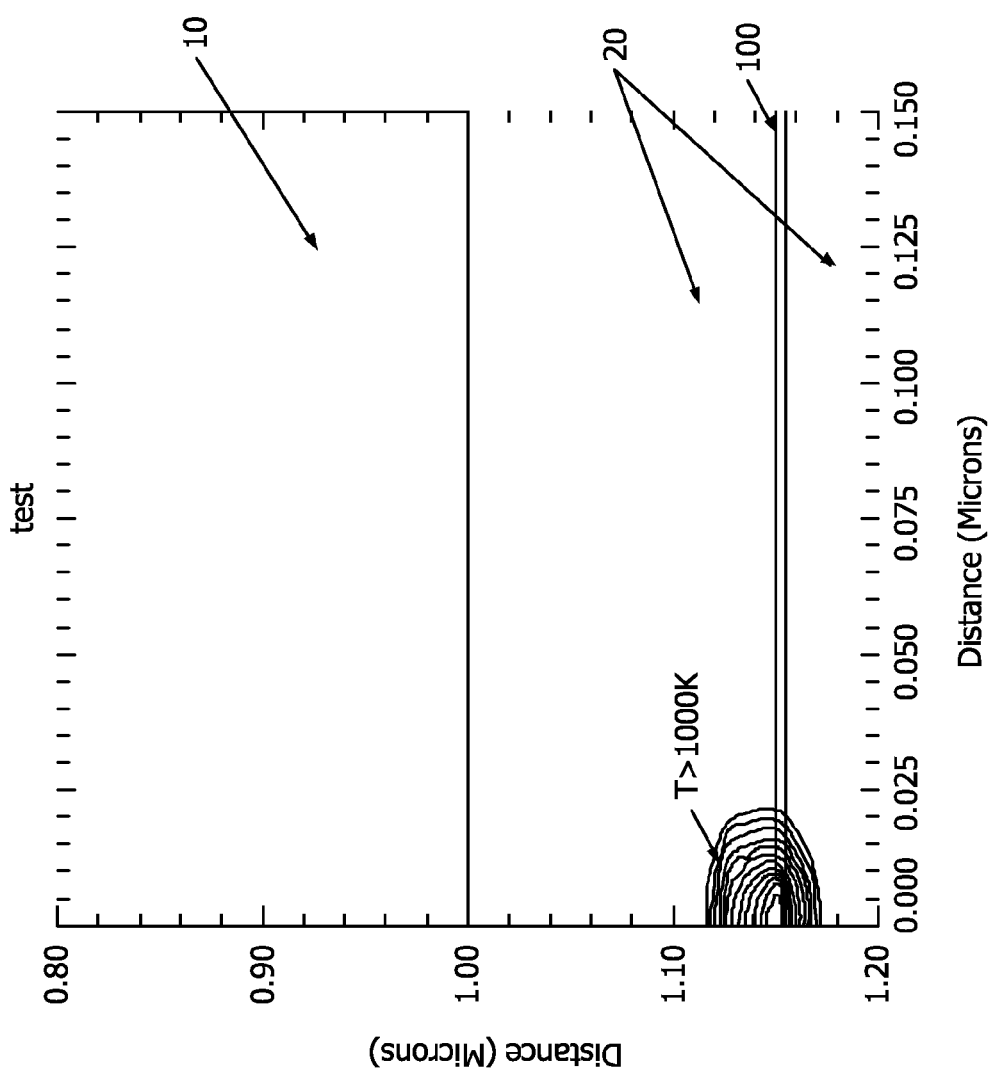
Figure 7:
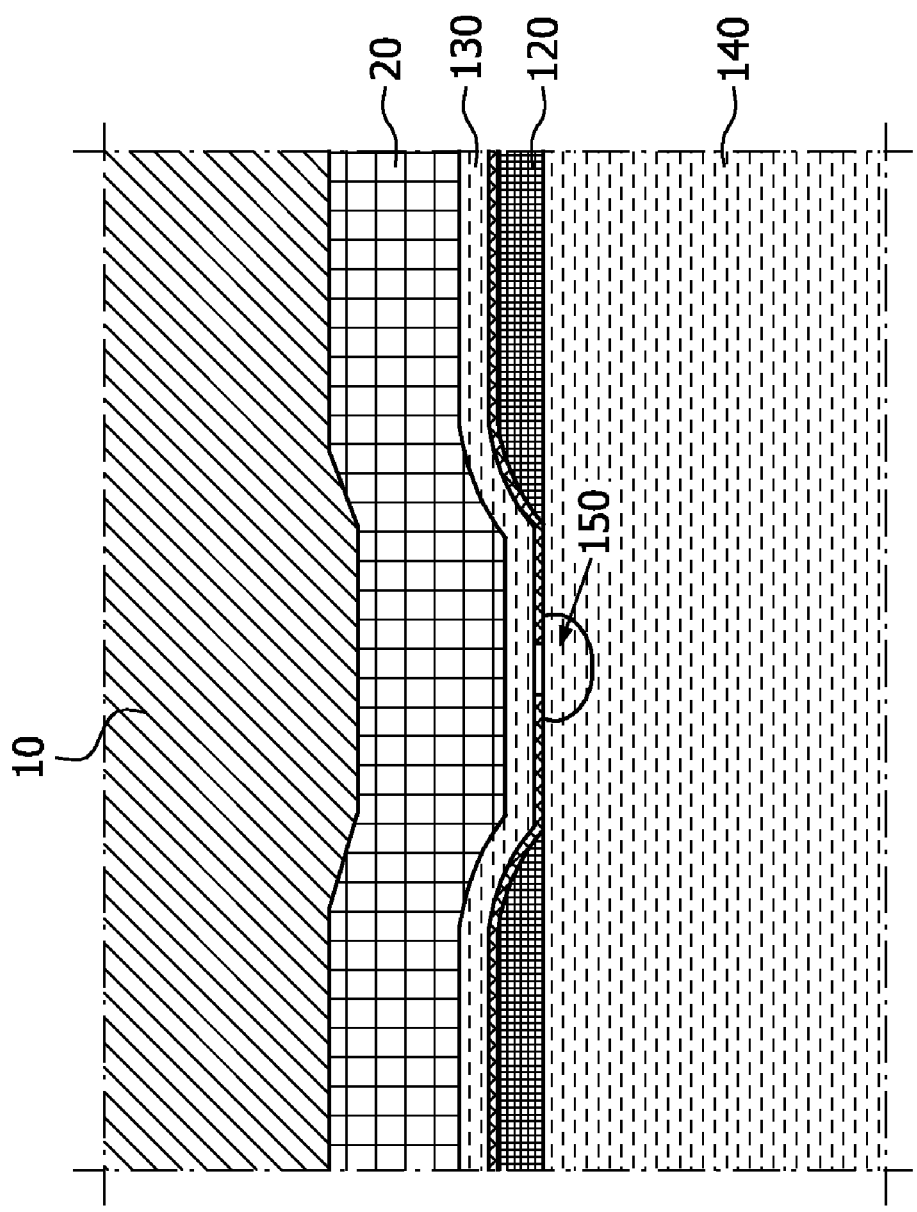
Figure 8:
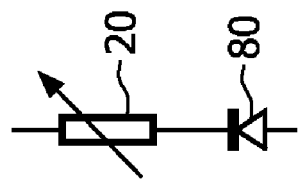

How the present invention may be put into effect will now be described by way of example with reference to the appended drawings, in which:

FIGS. 1, 2 and 3 show arrangements of thermally programmable structures according to known principles, FIG. 4 shows a structure of a thermally programmable device according to an embodiment of the invention, FIG. 5 shows a structure of a thermally programmable device according to another embodiment of the invention, showing an antifuse at a thin section of dielectric, FIG. 6 shows in cross section a device according to an embodiment, with lines of same temperature superimposed, FIG. 7 shows a structure of a thermally programmable device according to another embodiment of the invention, showing an antifuse having a pn diode, and FIG. 8 shows a schematic of an equivalent circuit of the device of FIG. 7.

Figure 9:
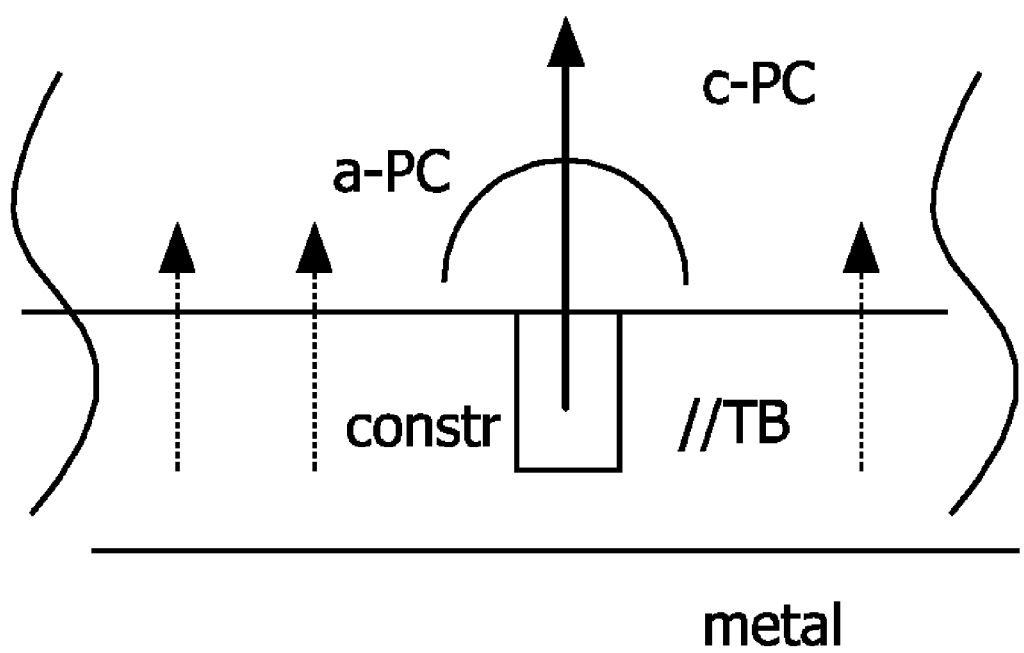

FIG. 9 shows a schematic representation of a breakdown through a tunnel barrier layer used in an embodiment of the present invention.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

It is furthermore to be noticed that the term "comprising", used in the description and in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Before describing embodiments, for reference, devices using known principles will be described briefly.

FIG. 1 shows an electrode 10 on a layer of programmable material 20. Part of this is a programmable volume 30, programmed by heating from an underlying resistive layer 40, on a dielectric substrate 50, the programmable volume being read via a lower electrode 50. FIGS. 2 and 3 show similar arrangements and corresponding reference numerals have been used as appropriate. Both Figures show an indication of current flow lines 60 from the lower electrode to or from the upper electrode for reading the resistance level or reading the memory. In the case of FIG. 2, the lower electrode has a smaller contact area with the programmable material layer 20, than is the case in FIG. 3. This means the current flow lines are more concentrated in FIG. 2, and so the volume of programmable material needed to show a given difference in resistance can be less as is shown. This should mean lower energy requirements for programming. But with conventional manufacturing processes, as the feature size is reduced beyond a certain level, reliability or yield will drop. So FIG. 2 explains how the programmable volume depends on the size of the contact.

The embodiments described below are concerned with the programming power needed to bring the material from the low-resistive crystalline state to the high-resistive amorphous state. For this transition a short pulse (typically in the order of 10 ns) with a high power is needed, followed by a quenching of the material. The programming power is determined by 1) the programmable volume of the material 2) the proximity of the heat source to the programmable volume and 3) the thermal properties of the materials surrounding the heat source. The dimensions of the cross section of the electrode through which the current enters the programmable material determines the programmable volume. If the current enters the programmable layer through a wide cross section the programmable volume needed to increase the total resistance is large. If the current enters the programmable layer through a narrow cross section the programmable volume is small (as shown in FIG. 2).

The phase-change material can be semiconducting in the amorphous phase. In the crystalline phase it can be a semimetal that cannot be used in a pn junction. After processing the phase-change layer will be in its crystalline phase and a Schottky barrier may be formed.

A first embodiment of the invention, illustrated in FIG. 4 shows an example of a blown antifuse adjacent to a programmable material layer. The antifuse structure as shown includes a dielectric layer 100, sandwiched between two conductive layers 90 and 110. Initially the dielectric layer is insulating, until the antifuse is blown. After blowing the antifuse conducts electricity. Blowing the antifuse involves a brief high voltage being applied across the dielectric layer 100. The antifuse is located adjacent to the programmable layer and above the lower electrode, in order to create a very small cross section through which the current enters the programmable layer. Basically the antifuse consists of a dielectric layer sandwiched between a top layer 90 (layer 1 in FIG. 4) and a bottom layer 110 (layer 2). Initially, the dielectric layer is intact. After the application of a sufficiently large voltage across the layer during a short time a small hole is formed, e.g. of a diameter in the order of 10-50 nm or more, such as 100 nm. Antifuses consisting of different materials (silicon, metal, silicide) are known. See for example C. de Graaf et al, "A Novel High-Density Low-Cost Diode Programmable Read Only Memory", Proc. IEDM 1996, p. 189, and V. Houtsma, "Gate Oxide Reliability of Poly-Si and poly SiGe CMOS devices", Ph. D. Thesis, Twente University, 1999.

Using this anti fuse has two advantages:
1) In and around the hole in the dielectric layer the electrical current flows through a very small cross section, leading to a large electrical resistance. So the material in and around the hole forms the electrical heater close to the programmable layer.
2) Because the hole in the dielectric is so small the programmable volume is small.

Both advantages 1 and 2 lead to a low programming power. To minimize this power both the thermal and electrical resistivity of the material in and around the hole should be high. Obviously, programming the antifuse needs to be done only once. One option is to do this after the full processing. Another option is to do this before the programmable layer is deposited. In that case the temporary contacts should be such that each memory cell can be addressed individually. These contacts and all layers up to the dielectric layer can subsequently be removed again and the rest of the processing can be done.

Two further embodiments are described, a first with reference to FIG. 5 and a second with reference to FIGS. 7 and 8, each with its own specific advantages. FIG. 5 shows an antifuse located between two programmable layers. In this embodiment, by having the antifuse is located between two programmable layers, more programmable material can be located adjacent to the heating element created by the antifuse. Both the programmable material and the dielectric materials have a high thermal and electrical resistivity. So the heating element is in the middle of the programmable material, right where it is needed and its electrical resistance is large because the specific resistance of the programmable material is high. Because the thermal diffusivity of the programmable material is low the thermal properties of the materials outside the programmable layers are not so relevant for a pulse duration in the order of 10 ns.

FIG. 6 shows a numerical simulation of one-half of such a structure where the programmable layers have a thickness of 150 nm. The oxide thickness is 5 nm and the diameter of the hole is 20 nm. The temperature contour lines denote the region around the hole where T>1000K after a pulse of 10 ns. The lines are contours of constant temperature, at t=10 ns. The outermost line is T=1000K, and beyond the outermost line, T is less than 1000K. This outermost line gives an estimate for the programmable volume in case the phase-change material has a crystallization temperature of 1000K. It can be advantageous if the programmable volume is sublithographic. In semiconductor processing a mask is used which is illuminated with radiation of a certain wavelength. There is a limit on feature size which can be achieved at a wavelength λ. This is usually λ/4 as a minimum. The term sublithographic means smaller in dimension than λ/4 where λ is the wavelength of the radiation used to define features of the semiconductor device.

FIGS. 7 and 8 show respectively a structure and equivalent circuit of a one-time programmable diode (DPROM) with a programmable resistor. It is well known that if the bottom (140) and top (130) plates of the antifuse are made of silicon layers which are oppositely doped, the formation of the antifuse leads to the formation of a small pn junction (150) around the hole in the dielectric layer. This is the basis of the well-known DPROM memory shown in C. de Graaf et al, "A Novel High-Density Low-Cost Diode Programmable Read Only Memory", Proc. IEDM 1996, p. 189. If such a DPROM is combined with the programmable resistor the equivalent circuit indicated in FIG. 8 is obtained. This shows a variable programmable resistor formed by the programmable material 20 in series with a diode formed by the antifuse 80. The availability of a small diode in a programmable-resistance based memory is highly desirable for the suppression of leakage currents and for the selection of the memory cell.

The programmable elements may be electrically coupled to isolation/selection devices and to addressing lines in order to form an array, e.g. a memory array. Such an array comprises individually or group addressable thermally programmable devices each having a programmable element of a thermally programmable material. The programmable devices are arranged logically in rows and columns and are individually selectable by selection devices. By "arranged logically in rows and columns" means that an addressing system is provided for addressing individual devices as if they were arranged in rows and columns, however the physical arrangement may be different, e.g. in a polar array, each memory element being at the intersection of a radius and a circle or a Cartesian array with the rows and columns at 90° to each other. Each thermally programmable device with its associated selection device forms a memory cell. Each thermally programmable device has a blown antifuse or a blowable antifuse located adjacent to the programmable material. Isolation/addressing devices permit each discrete memory cell to be read and written to without interfering with information stored in adjacent or remote memory cells of the array. The same addressing lines could be used for selecting each antifuse in turn to blow the antifuse during manufacture, or the high voltage could be applied to many or all antifuses simultaneously. The layer of phase change material can be an integral part of a selection device. The selection device can be a pn diode where the layer of phase change material is the n- or the p-doped layer. Other selection devices are included within the scope of the present invention, such as a pin diode, a punch through diode or a bipolar transistor.

Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies. Hence, associated with each memory element of a memory array structure is isolation/addressing device which serves as an isolation/addressing device for that memory element thereby enabling that cell to be read and written without interfering with information stored in other adjacent or remote memory elements of the array.

The programmable material can be programmable to two resistance states so that each of the memory elements is capable of storing a single bit of information. In another embodiment, the memory material is programmable to at least three resistance states so that each of the memory elements is capable of storing more than one bit of information. Hence, the memory materials may have a range of resistance values providing for "grey scale" storage of multiple bits of information in one cell.

The programmable materials may be directly overwritable so that they can be programmed from any of their resistance states to any other of their resistance states without first having to be set to a starting state. Preferably, the same programming pulse or pulses may be used to program the material to a specific resistance state regardless of its previous resistance state. (For example, the same current pulse or pulses may be used to program the material to its high resistance state regardless of its previous state). An example of a method of programming the element, reference is made to U.S. Pat. No. 6,075,719.

The programmable material may be any phase change memory material known in the art. Preferably, the phase change materials are capable of exhibiting a first order phase transition.

For examples of suitable materials reference is also made to U.S. Pat. No. 6,613,604, and the documents cited therein. This patent explains that the phase change materials may be formed from a plurality of atomic elements. Preferably, the programmable material includes at least one chalcogen element. The chalcogen element may be chosen from the group consisting of Te, Se, and mixtures or alloys thereof. The programmable material may further include at least one element selected from the group consisting of Ge, Sb, Bi, Pb, Sn, As, S, Si, P, O, and mixtures or alloys thereof. In one embodiment, the programmable material comprises the elements Te, Ge and Sb. In another embodiment, the programmable material consists essentially of Te, Ge and Sb. An example of a programmable material which may be used is $Te_2 Ge_2 Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_a Ge_b Sb_{(100-(a+b))})_c TM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_a Ge_b Sb_{(100-(a+b))})_c TM_d Se_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof. In another embodiment the phase change material is a composition of formula $Sb_a Te_b X_{100-(a+b)}$ with a, b and 100−(a+b) denoting atomic percentages satisfying $1 \leq a/b \leq 8$ and $4 \leq 100-(a+b) \leq 22$, and X being one or more elements selected from Ge, In, Ag, Ga and Zn.

The phase change material may be a fast growth material which preferably has a crystallization speed of at least 1 m/s. In one embodiment the phase change material is a composition of formula $Sb_{1-c} M_c$ with c satisfying $0.05 \leq c \leq 0.61$, and M being one or more elements selected from the group of Ge, In, Ag, Ga, Te, Zn and Sn. Preferably, c satisfies $0.05 \leq c \leq 0.5$. Even more preferably, c satisfies $0.10 \leq c \leq 0.5$. A group of advantageous phase change materials has one or more elements M other than Ge and Ga at concentrations which are in total smaller than 25 atomic percent and/or comprise in total less than 30 atomic percent of Ge and/or Ga. Phase change materials comprising more than 20 atomic percent of Ge and Ga and one or more elements selected from In and Sn at concentrations which are in total between 5 and 20 atomic percent have a relatively high crystallization speed and at the same time a relatively high stability of the amorphous phase.

In a process for manufacturing an integrated circuit having many of the devices, in an array of memory cells, first an array of selection devices and a grid of selection lines are formed, embedded in a dielectric material 60 such as silicon dioxide, using standard IC technology. Next the surface is prepared for formation of layers of the antifuse device.

The thickness of the dielectric may be between 4-25 nm, and will form the antifuse device. Any suitable dielectric with a thickness below 25 nm may be used, e.g. between 4-25 nm Si dioxide. On the other hand below 4 nm can result in a tunnel barrier, whereby the term 'tunnel barrier' assumes that there is still some direct tunneling possible.

Next the programmable material may be deposited by sputtering as described in the article by Stefan Lai "Current status of the phase change memory and its future", IEDM 2003. The thickness of the programmable material is typically 5-70 nm, e.g. 10 to 60 nm, preferably 15 nm.

The size of the hole formed by blowing the antifuse will depend on the power used. Typically 100 μW-several mW can be used, at a voltage of 7-10 v, depending on the thickness of the dielectric layer. This should be carried out under conditions of carefully controlled power dissipation, series resistance, parasitic capacitance, and so on, to enable the size of the hole and thus the resistance of the blown antifuse to be controlled. The hole may be smaller than can be obtained by conventional IC processing technology such as photolithography. To ensure reliability of the reading and reprogramming path through the very small area of the antifuse, over the lifetime of the device, and for good yield from the manufacturing process, careful choice of materials making contact with the antifuse needs to be made. On top of the programmable material, further selection lines and selection or addressing devices can be formed according to conventional practice.

In a particular embodiment of the present invention, the material used for dielectric layer which forms the antifuse is selected to reduce the size of the conductive path after breakdown. In an embodiment of a phase-change memory cell in accordance with the present invention, a tunnel barrier layer is used as the antifuse which will eventually be broken down. Preferably, breakdown of the tunnel barrier provides a single breakdown event that in fact can be controllably induced if a certain voltage is overcome, e.g. ~about 2 Volt, such as 1.5 to 2 Volt for typical Al oxide device as used in MRAM. The present invention includes the use of tunnel barrier materials with a lower breakdown voltage. For example materials may be selected for use with a supply voltage of 1.1 V. Alternative solutions include (1) a burn-in step at higher temperature (hence lower $V_{BD}$), or (2) the addition of an extra contact pad that is accessible during the testing phase and that allows for the use of a higher voltage at that time. More breakdown events at different locations in the sample at higher voltages can be reduced or prevented by addition of a current compliance, e.g. in the form of a current limiting device such as a series resistor which immediately limits the effective voltage over the tunnel barrier upon breakdown. A series transistor in the memory cell can also be used for this purpose. In accordance with an aspect of the present invention an in-built current compliance means is provided in a memory cell to allow a controllable intentional breakdown of the device.

A preferred tunnel barrier layer is made from Aluminum Oxide. Other materials may be used comprising different insulating compounds, e.g. a compound of Hf, Zr, Al, Mg, Cr, Ga, Si, Ta, Ti, B, Y, Nb, with O, N, S, C thereby forming an insulating material. The insulating layer, e.g. an Al oxide layer, can be integrated immediately on top of, or below the phase-change layer. The other layer adjacent to the tunnel barrier can be arbitrarily chosen, in line with compatibility requirements for processing, e.g. CMOS integration, such as the need for material stability in a back-end process. In an alternative embodiment, the Al oxide layer can also be sandwiched between two identical phase-change layers. In a further embodiment, the Al oxide layer can be used to separate two different phase-change layers that may be used to yield a multi-level phase-change cell. In this respect the Al oxide layer can also act as a diffusion barrier between the two different materials. In a further embodiment, the Al oxide layer can also be integrated in such a way that it is not in direct contact with the phase-change layer. By addition of a different layer, the effective size of the constriction upon breakdown, that is relevant for the transport properties during programming of the memory cell, can be varied. The effective size will be approximately a linear function of the thickness of this extra layer.

The aluminum oxide layer can be fabricated by depositing a thin precursor Al layer, followed by a post-oxidation step. Depending on the exact precursor layer thickness as well as the oxidation method and conditions, the tunnel barrier resistance can be tuned over more than 10 orders of magnitude, starting at a few tens of Ohms to many Giga-Ohms for a device size of 1 micron squared. The resistance-area product varies from ohm.μm$^2$ to well over Gohm.μm$^2$. The Al precursor layer thickness can be varied from below 1 nanometer (e.g. 6-8 Angstrom) to approximately 2 nm. After oxidation, the Al oxide is slightly thicker, in the order of 20 to 30%. Any suitable oxidation method can be used, e.g. thermal oxidation, UV-light assisted thermal oxidation, glow discharge oxidation, either DC or RF, etc. Oxidation may be carried in pure oxygen or noble gas/oxygen mixtures, preferably in situ, that is in vacuum. From experiments, the temperature stability of the Al oxide layer, obtained with the methods described above, during post-processing anneals has been verified to survive anneal temperatures above 400° C. The insulating quality of the tunnel barrier generally improves with anneal temperature as can be expected for an insulating layer that has been obtained at, or close to, room temperature. The advantage of room temperature deposition of the Al precursor layer is that a very sharp interface with any underlying layer can be obtained, after which the Al is oxidized into Al oxide. This prevents a solid-state reaction with the adjacent layers in later processing or annealing steps.

Given the difference in resistivities between typical phase-change layers that exhibit an amorphous (>Mohm.cm) and crystalline (100 s of ohm.cm) state and magnetic materials (~20 ohm.cm), the Al precursor, hence tunnel barrier resistance, must be chosen adequately to cancel any direct tunneling processes in either of the states close to the constriction. Given the fact that complete phase-change layer will be in its crystalline phase after processing (due to the thermal budget of a back-end process), the effective resistance of the constriction is preferably lower than that of the remaining part of the parallel tunneling device that is not effected by the breakdown process. A simple example will be described with reference to FIG. 9. A finite parallel tunnel junction 'device' size (//TJ) is assumed, e.g. 1 µm², in which a low-ohmic constriction (constr) has been made. The resistance after breakdown of the barrier layer will be in the order of 10 ohms. For amorphous material in the constriction area, this may be several orders of magnitude higher, e.g. a factor 1000. A simple extrapolation for voltage bias, stating that $I_{//TJ} \ll I_{constr}$, leads to the requirement that $R_{constr} \ll R_{//TJ} = [R \times A]_{//TJ}/A_{//TJ}$. For 1% leakage, the minimal value for [R×A]/TJ would be 1 Mohm.µm², which can be obtained for a tunnel barrier, e.g. made of aluminum oxide as described above. This resistance is a minimum value, and higher values are preferably achieved for the tunnel barrier if lower parallel leakage values are required.

The use of a tunnel barrier layer such as an Al oxide layer as the dielectric layer which forms the antifuse has the advantage of controllable constriction size after blowing as well a producing very small constriction sizes, for example below 10 nm in diameter. Insulating layers such as Al oxide ultra-thin layers generate on breakdown constrictions to guide the current into a smaller volume of phase change material. A further advantage is that such a layer prevents or reduces solid-state reactions and/or improves adhesion between the phase-change layer and a different adjacent layer, e.g. a W-plug below, or TiN or TaN barrier layers below and/or on top of the phase-change layer, that are used in CMOS back-end. An Al oxide layer acts as a diffusion barrier between the phase change material and a different layer. For example, a tunnel barrier layer can prevent that Ti and Ta reacts with the phase-change material resulting in a reduced endurance (cyclability) of the memory cells. The barrier layer may reduce or prevent delamination of the electrodes due to poor adhesion between electrode and phase-change material. Al oxide is a very good adhesion layer that is able to solve some of the integration issues of phase-change materials into CMOS processes, such as adhesion.

Furthermore, the thermal stability of a barrier layer as described above complies with a back-end process.

In a further embodiment of the present invention an Al oxide layer is integrated in the ultra-low resistive, direct tunneling mode. For instance, a layer of only a few Angstrom Al (e.g. below 1 nm) may improve the adhesion of the phase-change layer with an adjacent layer, only resulting in a series resistance with a negligible value. The present invention includes within its scope use of an Al oxide layer for at least one of antifuse, diffusion barrier and/or adhesion layer. The present invention also includes within its scope the use of multiple Al oxide layers within a single phase-change memory cell for different purposes, i.e. at least two of antifuse, diffusion barrier and/or adhesion layer.

As has been described above, a thermally programmable memory has a programmable element (20) of a thermally programmable resistance material and a blowable or blown antifuse (80) located adjacent to and in contact with the programmable material. The blown or blowable antifuse may be made of a dielectric tunnel barrier layer such as an aluminum oxide layer. The thickness of the aluminum oxide layer is preferably suitable to form a tunneling layer, e.g. less than 10 nm, preferably less than 4 nm, for instance 0.5-3.0 nm. One or more layers such as Al oxide layers of a suitable thickness, e.g. less than 10 nm, such as 0.5-3.0 nm, may be included in the memory for other purposes, e.g. to prevent diffusion and/or to improve adhesion. A blown or blowable antifuse in accordance with embodiments of the present invention can be formed from a dielectric layer surrounded by conductive layers to enable a brief high voltage to be applied across the dielectric to blow a small hole in the dielectric during manufacture to form a small conductive path which can be used a tiny electrical heater for programming the material. Due to the current confinement by the hole, the volume of the material that must be heated in order to switch to a highly-resistive state is very small. As a result the programming power can be low. This can help reduce the dimensions of the programmable material and thus enable higher levels of integration, and reduced power supply requirements.

Other variations can be conceived within the scope of the claims.

The invention claimed is:

1. A thermally programmable device comprising:
    a programmable element of a thermally programmable material; and
    a blown antifuse or a blowable antifuse located adjacent to the programmable material;
    the antifuse having a dielectric layer surrounded by conductive layers and the conductive layers being formed of semiconductor material of opposite doping, so as to form a pn junction at the antifuse.

2. The device of claim 1, the programmable material having a programmable resistance.

3. The device of claim 1, the blown antifuse being located to serve as part of an electrical path for reading a state of the programmable material.

4. The device of claim 1, the blown antifuse being arranged to serve as an electrical heater for setting a state of the programmable material.

5. The device of claim 1, having a first electrode located below the antifuse, the programming material being located on the antifuse, and a second electrode located on the programming material.

6. The device of claim 1, having a second volume of programmable material located so that the antifuse is between the programmable material and the second volume of programmable material.

7. The device of claim 1, the blown antifuse having a hole in the dielectric layer of diameter less than 100 nm.

8. The device of claim 1 wherein the antifuse is an integral part of a selection device.

9. The device according to claim 8, wherein the selection device is a pn diode.

10. The device of claim 8, wherein the selection device includes a layer of phase change material.

11. The device of claim 10, wherein the layer of phase change material is an n-or the p-doped layer.

12. A array of addressable cells, each cell comprising the device of claim 1.

13. A memory having multiple addressable cells, each cell comprising the device of claim 1.

14. The memory of claim 13, cells being reprogrammable cells.

15. An integrated circuit having the device of claim 1.

16. A method of manufacturing a device as set out in claim 1 having the steps of forming the antifuse and the element of a programmable material adjacent to each other, and blowing the antifuse before or after the programmable material is formed.

17. The method of claim 16, and forming other layers after the antifuse is blown.

18. The method of claim 16 further comprising forming the antifuse by forming bottom and top semiconductor layers which are oppositely doped, to form the pn diode.

19. The device of claim 1 wherein the antifuse is a tunnel barrier layer.

20. The device of claim 19, wherein the tunnel barrier layer is an insulating layer made of a compound of any of Al, Hf, Zr, Al, Mg, Cr. Si, Ga, Ti, Ta, B, Y, Nb, with O,N,S,C.

21. The device of claim 1, further comprising an aluminum oxide layer.

22. A thermally programmable device comprising:
   a programmable element of a thermally programmable material; and
   a blown antifuse or a blowable antifuse located adjacent to the programmable material, wherein the antifuse is a tunnel barrier layer that is less than 4 nm thick.

23. The device of claim 22 wherein the tunnel barrier layer is an aluminum oxide layer.

* * * * *